United States Patent
Li et al.

(10) Patent No.: US 12,288,142 B2
(45) Date of Patent: Apr. 29, 2025

(54) SPARSITY-AWARE COMPUTE-IN-MEMORY

(71) Applicant: QUALCOMM Incorporated, San Diego, CA (US)

(72) Inventors: Ren Li, San Diego, CA (US); Ankit Srivastava, San Diego, CA (US); Seyed Arash Mirhaj, Poway, CA (US); Sameer Wadhwa, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 918 days.

(21) Appl. No.: 17/397,653

(22) Filed: Aug. 9, 2021

(65) Prior Publication Data

US 2023/0049323 A1    Feb. 16, 2023

(51) Int. Cl.
*G06N 20/00* (2019.01)
*H03K 19/20* (2006.01)
*H03M 7/30* (2006.01)

(52) U.S. Cl.
CPC .............. *G06N 20/00* (2019.01); *H03K 19/20* (2013.01); *H03M 7/30* (2013.01)

(58) Field of Classification Search
CPC .................................................... G06N 20/00
USPC ......................................................... 706/12
See application file for complete search history.

(56) References Cited

U.S. PATENT DOCUMENTS

| | | | |
|---|---|---|---|
| 10,176,435 B1* | 1/2019 | Sarkar | G06N 20/00 |
| 11,955,167 B2* | 4/2024 | Gu | G06N 3/063 |
| 2018/0164866 A1* | 6/2018 | Turakhia | G06N 3/063 |
| 2018/0293691 A1* | 10/2018 | Nurvitadhi | G06N 3/084 |
| 2020/0274894 A1* | 8/2020 | Argoeti | H04L 63/1433 |
| 2021/0027722 A1* | 1/2021 | Rao | G06F 3/0412 |
| 2021/0193196 A1* | 6/2021 | Augustine | G11C 7/1021 |
| 2021/0248467 A1* | 8/2021 | Mohamed | G06F 18/2413 |
| 2021/0248822 A1* | 8/2021 | Choi | G02B 27/017 |
| 2022/0188600 A1* | 6/2022 | Li | G06F 7/5443 |

(Continued)

FOREIGN PATENT DOCUMENTS

| | | |
|---|---|---|
| CN | 111026700 A | 4/2020 |
| CN | 111079919 A | 4/2020 |
| KR | 20210059623 A | 5/2021 |
| WO | 2019246064 A1 | 12/2019 |

OTHER PUBLICATIONS

Fangxin L., et al., "SME: ReRAM-Based Sparse-Multiplication-Engine to Squeeze-Out Bit Sparsity of Neural Network", Mar. 2, 2021, pp. 417-424 (Year: 2021).*

(Continued)

*Primary Examiner* — Reza Nabi
(74) *Attorney, Agent, or Firm* — QUALCOMM Incorporated

(57) ABSTRACT

Certain aspects of the present disclosure provide techniques for performing machine learning computations in a compute in memory (CIM) array comprising a plurality of bit cells, including: determining that a sparsity of input data to a machine learning model exceeds an input data sparsity threshold; disabling one or more bit cells in the CIM array based on the sparsity of the input data prior to processing the input data; processing the input data with bit cells not disabled in the CIM array to generate an output value; applying a compensation to the output value based on the sparsity to generate a compensated output value; and outputting the compensated output value.

28 Claims, 9 Drawing Sheets

(56) References Cited

U.S. PATENT DOCUMENTS

| | | | | |
|---|---|---|---|---|
| 2022/0284952 | A1* | 9/2022 | Wang | G11C 13/0023 |
| 2022/0405933 | A1* | 12/2022 | Tajbakhsh | G06N 3/0895 |
| 2023/0008550 | A1* | 1/2023 | Bock | H04N 25/74 |
| 2023/0049323 | A1* | 2/2023 | Li | G06F 15/7821 |
| 2023/0252299 | A1* | 8/2023 | Kundu | G06N 3/08 |
| | | | | 706/15 |
| 2023/0325665 | A1* | 10/2023 | Langhammer | G06N 3/0464 |
| 2023/0376765 | A1* | 11/2023 | Wagholikar | G06N 3/08 |
| 2024/0103519 | A1* | 3/2024 | Mene | G05D 1/0214 |
| 2024/0160269 | A1* | 5/2024 | Jha | G06F 1/3206 |
| 2024/0201949 | A1* | 6/2024 | Sayyaparaju | G06F 7/50 |

OTHER PUBLICATIONS

Yang T.H., et al., "Sparse ReRAM Engine Joint Exploration of Activation and Weight Sparsity in Compressed Neural Networks", Proceedings of the 2020 Chi Conference on Human Factors in Computing Systems, ACMPUB27, New York, NY, USA, Jun. 22, 2019, pp. 236-249 (Year: 2019).*

Fangxin L., et al., "SME: ReRAM-Based Sparse-Multiplication-Engine to Squeeze-Out Bit Sparsity of Neural Network", Mar. 2, 2021, pp. 417-424, XP055981405, DOI: 10.1109/ICCD53106.2021. 00072 ISBN: 978-1-6654-3219-1, p. 1-p. 4.

International Search Report and Written Opinion—PCT/US2022/ 074660—ISA/EPO—Nov. 28, 2022.

Yang T.H., et al., "Sparse ReRAM Engine Joint Exploration of Activation and Weight Sparsity in Compressed Neural Networks", Proceedings of the 2020 Chi Conference on Human Factors in Computing Systems, ACMPUB27, New York, NY, USA, Jun. 22, 2019, pp. 236-249, XP058547138, DOI: 10.1145/3307650.3322271 ISBN: 978-1-4503-6708-0 p. 236-p. 243.

Wang et al., "SNrram: An Efficient Sparse Neural Network Computation Architecture Based on Resistive Random-Access Memory", Design Automation Conference (DAC), Jun. 24-29, 2018, San Francisco, CA, USA, 6 Pages, DOI: https://doi.org/10.1145/3195970. 3196116.

* cited by examiner

SPARSITY-AWARE COMPUTE-IN-MEMORY

Aspects of the present disclosure relate to computation in memory, and in particular to computation of machine learning data using compute-in-memory (CIM) systems.

Machine learning techniques, such as deep learning, have proven a powerful tool in many domains. Given their computational complexity, though, machine learning tasks, such as training and inferencing, have conventionally been performed on powerful, purpose-built computing hardware. Presently, there is a desire to implement machine learning tasks on lower power devices, such as edge devices, in order to enhance the capabilities of such devices and the services they enable. For example, the wide availability and variety of mobile devices and Internet-of-Things (IoT) devices represents a compelling opportunity for deploying machine learning in myriad new contexts.

However, implementing complex machine learning tasks on lower power devices creates new challenges with respect to the design constraints of such devices, such as with respect to power consumption, computational efficiency, and memory footprint, to name a few examples. Consequently, improving the efficiency of various machine learning model architectures has been an area of focused research and development. Unfortunately, efficient architectures, by themselves, may not be sufficient to enable complex machine learning tasks to be implemented on low power devices—especially where large models and/or time consuming computations are necessary to get good performance for some particular task.

Accordingly, new techniques are needed for improving the efficiency of machine learning processing.

BRIEF SUMMARY

One aspect provides a method, comprising: disabling one or more bit cells in a compute-in-memory (CIM) array based on a sparsity of input data for a machine learning model prior to processing the input data; processing the input data with bit cells not disabled in the CIM array to generate an output value; applying a compensation to the output value based on the sparsity of the input data to generate a compensated output value; and outputting the compensated output value.

Another aspect provides a method, comprising: resequencing weight data for a machine learning model according to sparsity; disabling one or more bit cells in a compute-in-memory (CIM) array based on the resequenced weight data; resequencing input data based on the resequenced weight data; processing the input data with bit cells not disabled in the CIM array to generate an output value; applying a compensation to the output value based on the sparsity to generate a compensated output value; and outputting the compensated output value.

Other aspects provide processing systems configured to perform the aforementioned methods as well as those described herein; non-transitory, computer-readable media comprising instructions that, when executed by one or more processors of a processing system, cause the processing system to perform the aforementioned methods as well as those described herein; a computer program product embodied on a computer readable storage medium comprising code for performing the aforementioned methods as well as those further described herein; and a processing system comprising means for performing the aforementioned methods as well as those further described herein.

The following description and the related drawings set forth in detail certain illustrative features of one or more aspects.

BRIEF DESCRIPTION OF THE DRAWINGS

The appended figures depict certain aspects of the one or more aspects and are therefore not to be considered limiting of the scope of this disclosure.

To facilitate understanding, identical reference numerals have been used, where possible, to designate identical elements that are common to the drawings. It is contemplated that elements and features of one aspect may be beneficially incorporated in other aspects without further recitation.

DETAILED DESCRIPTION

Figure 1:
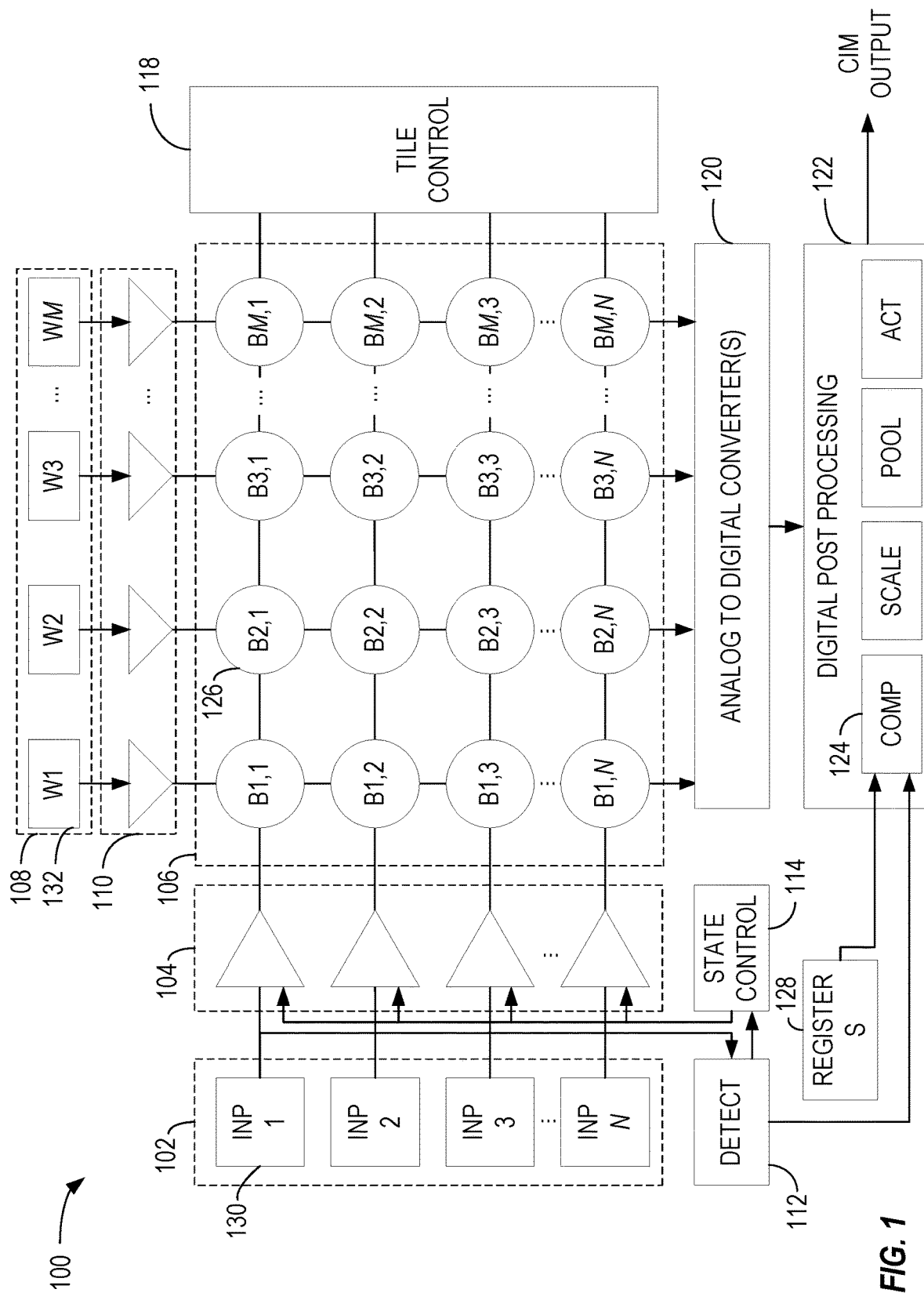
FIG. 1 depicts an example compute-in-memory (CIM) architecture.

Aspects of the present disclosure provide apparatuses, methods, processing systems, and computer readable mediums for sparsity-aware computation of machine learning data using compute-in-memory (CIM) systems.

Computation in memory has evolved as an alternative (or complement) to conventional processing architectures, which improves power efficiency by reducing the need to move data back and forth between memory and various types of conventional processing units, such as graphics processing units (GPUs), digital signal processors (DSPs), neural processing units (NPUs), and the like. CIM may thus help to overcome the so-called "memory wall" problem in modern data processing systems, wherein the resources (e.g., power) and time expended moving data exceed that used to actually process data.

Computation in memory can be particularly useful for data-intensive tasks, such as processing machine learning data to perform machine learning tasks, including training and inferencing. However, even with the inherent efficiencies of performing the computation in memory, there are still opportunities to improve the efficiency of processing machine learning data in memory (e.g., in CIM-based machine learning and/or artificial intelligence accelerators).

Input data to machine learning models, such as deep neural network (DNN) models, may be sparse (e.g., having a significant number of "zero"-valued inputs). Moreover, many popular machine learning architectures, such as various convolution neural network (CNN) architectures, include nonlinear activation functions between layers (e.g., a rectified linear unit (ReLU) or the like), which generate additional sparseness as activations traverse model layers. For example, ReLU discards all negative input values, creating more zero-valued inputs to successive layers, and thus more sparseness as data traverses a model. Further yet, training of machine learning models may produce weights that approach zero, thereby creating additional data sparseness throughout the layers.

Further yet, a model's weights may also be sparse, which creates additional sparseness during processing of input data with the weights.

Generally, skipping computations with zero-valued input data or zero-valued weights can improve power consumption and reduce processing time associated with data processing, including machine learning data processing. While reduced power consumption and reduced processing latency are generally beneficial, both are especially beneficial for lower power devices, including mobile devices, edge processing devices, Internet of Things (IoT) devices, "always-on" devices, and the like. Such improvement may make the difference between the inability and the ability to implement machine learning (or more generally, "artificial intelligence") capabilities in various types of devices.

Aspects described herein relate to architectures for detecting input data sparseness and weight data sparseness, as well as corresponding control of a CIM array to achieve improved power efficiency and processing efficiency. In many cases, the aspects described herein may result in a 50% or greater reduction in processing power compared to conventional methods, and a similarly significant reduction in processing time.

In particular, aspects described herein relate to methods for detecting sparseness and controlling bit cell operations for input data, including multibit input data (e.g., processed in a bit serial fashion), based on the detected sparseness. For example, based on detecting a sparse input at an input row in a CIM array, the row may be selectively disabled (e.g., put into a high-impedance mode so that it is effectively removed from the processing circuit, or "tristated"), which saves the power of processing the disabled row. Further, the effect of disabling the input row on the analog calculation within the CIM array (e.g., on an accumulation process, such as a charge accumulation) may be compensated in digital hardware following the CIM array. Beneficially, power savings are thus achieved without compromising CIM processing accuracy.

Further, the CIM processing architectures described herein enable both "AND" and "XNOR" operation modes for CIM array bit cells, which can support 2 s complement data format natively, thereby avoiding the need for expensive hardware-based data format conversions.

Finally, aspects described herein enable sorting and rearranging weight data (e.g., a weight matrix) based on weight data sparseness so that portions of a CIM array (e.g., "tiles") may be selectively disabled for further power savings.

Example Compute-In-Memory Architecture

FIG. 1 depicts an example compute-in-memory (CIM) architecture 100 including a CIM array 106.

Figure 4:
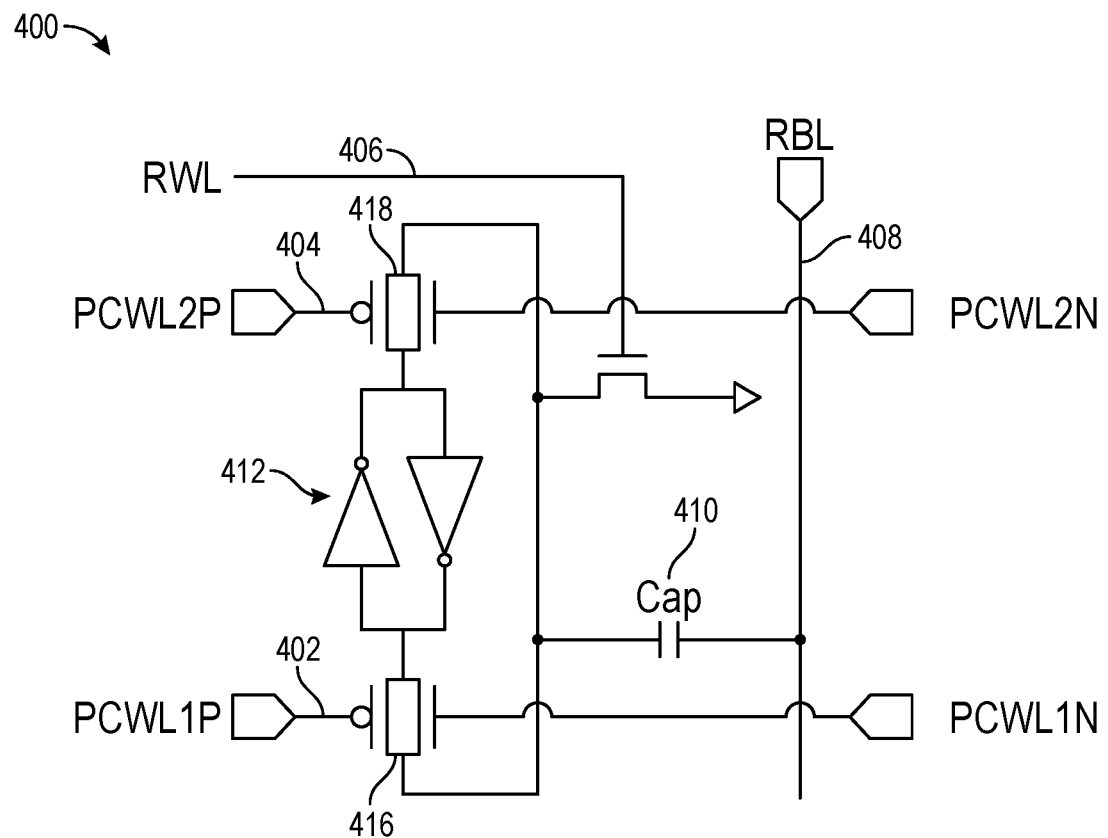
FIG. 4 depicts an example bit cell, which may be implemented in various aspects described herein.

CIM array 106 includes a plurality of bit cells 126, an example of which is described in more detail with respect to FIG. 4. In the depicted example, the CIM array 106 is configured for N bits of input data (loaded in the rows of the CIM array) and M bits of weight data (loaded in the columns of the CIM array). In one example, N=1024 and M=256, but many other configurations are possible.

In the depicted example, each of the bit cells 126 is connected to an input data node 130 (e.g., INP 1 . . . N), which collectively store input data 102 (e.g., activation data) for processing by CIM array 106. In some aspects, each input data node 102 may store one or more bits of input data. For example, each input data node may store input data for processing a layer of a neural network model by CIM array 106. Input data 102 may be received from an input data buffer (not depicted).

In some cases, such as when processing convolutional neural network (CNN) data, input data 102 may generally include input bits for one or more patches of input data, which may alternatively be referred to as receptive fields. For example, a 3×3 patch of binary input data would require nine 1-bit input data nodes 130. Note that multi-bit input data may be sequentially processed in 1-bit sets (e.g., in a bit-serial fashion).

CIM array 106 further includes a plurality of weight data nodes 132, which collectively store weight data 108 to be applied to bit cells 126 for processing of input data. In some aspects, each weight data node 132 may store one or more bits of weight data. Generally, a binary weight (e.g., a kernel weight for a CNN) may be stored in a single bit cell (e.g., 126), and multibit weights are stored in a plurality of bit cells (e.g., 126). For example, a two-bit weight would be written to two bit cells (e.g., B1,1 and B2,1 in this example).

CIM array 106 is generally configured to process input data 102, such as by performing multiply-accumulate (MAC) operations between input data 102 and weight data 108. For example, weight data 108 may be stored in the bit cells 126 of CIM array 106, then input data 102 may be applied to weight data 108, and then an accumulation may occur at the output of CIM array 106.

Figure 2:
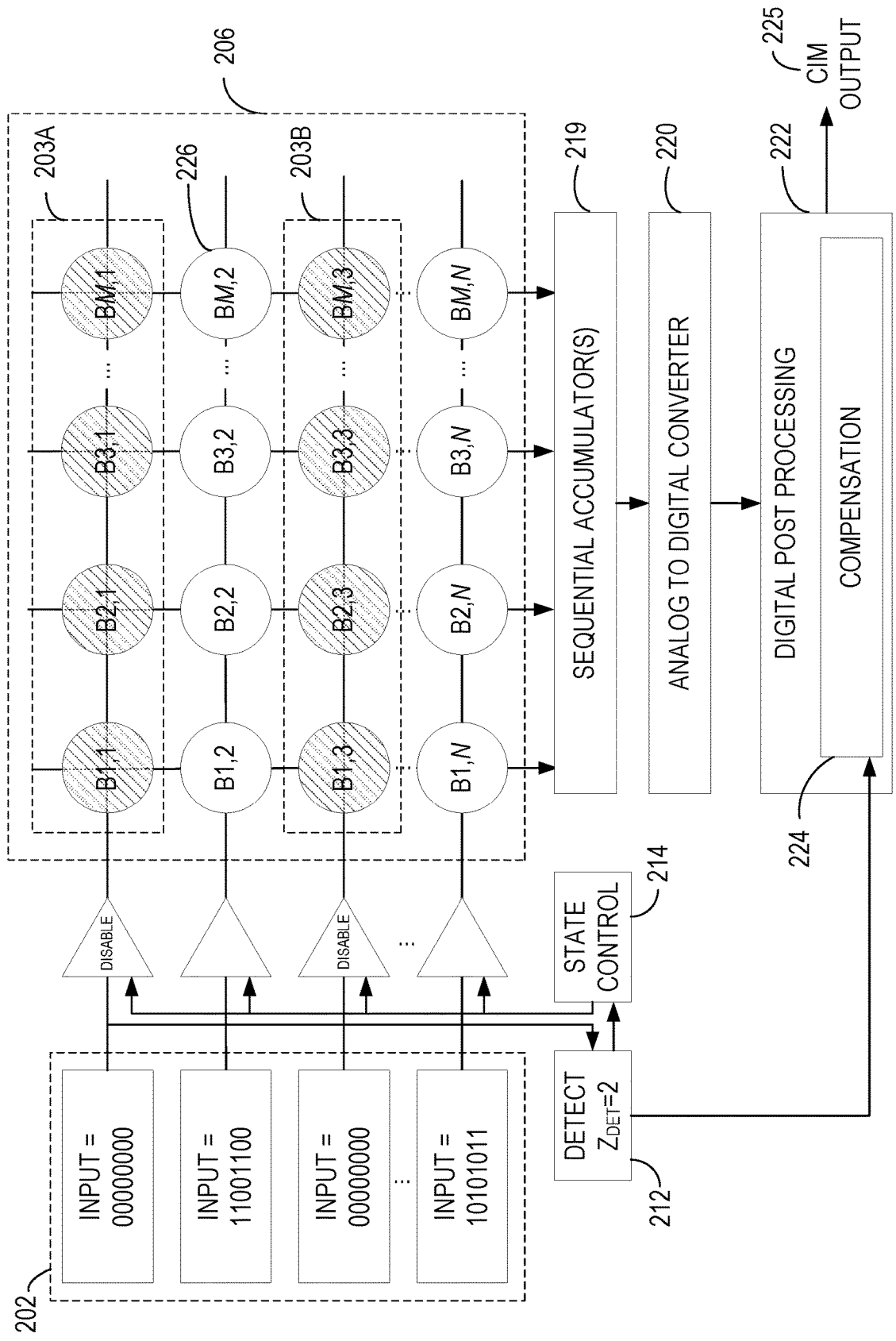
FIG. 2 depicts an example of input data sparsity detection using aspects of the CIM architecture of FIG. 1.

The outputs of CIM array 106 are connected to one or more analog-to-digital converters (ADCs) 120, which process the analog domain signals and generate digital domain output data. While not depicted in FIG. 1, architecture 100 may further include sequential accumulators connected between the outputs of CIM array 106 and ADC(s) 120, and configured to perform sequential accumulation (e.g., voltage accumulation) across columns of CIM array 106 during CIM processing. FIG. 2 depicts and describes an example of a sequential accumulator.

Digital domain data from ADC(s) 120 is provided to a digital post processing (DPP) component 122, which includes several sub-components in this example, including a scaling component, pooling component, and activation component. For example, the pooling component may be a max or average pooling component. The activation component may be a nonlinear activation component configured to implement, for example, ReLU, sigmoid, tanh, Swish, and variations, such as ReLU6, Parametric Rectified Linear Unit (PReLU), Gaussian Error Linear Unit (GELU), hyperbolic tangent (tanh), and others.

CIM architecture 100 further includes input data sparsity detection component 112, which is configured to detect sparsity in input data 102. An example of a sparsity detection circuit is described in more detail with respect to FIG. 3.

In one example, input data sparsity detection component 112 may be configured to determine each input data node 130 storing sparse input data (e.g., zero-valued input data) as well as how many input data nodes are storing sparse data prior to processing input data in CIM array 106. An example method for determining sparsity in input data 102 is further described with respect to FIG. 3.

Input data sparsity detection component 112 outputs sparsity detection data to state control component 114, which is configured to selectively disable (e.g., tristate) one or more rows (including, for example, one or more word lines connected to bit cells in that row) based on the detected sparsity. For example, if input data sparsity detection component 112 detects zero-valued input data in input data nodes INP1 and INP2, it may disable the rows associated with those nodes prior to processing data in CIM array 106 because zero multiplied by any weight stored in the bit cells along those rows is still zero.

In some cases, input data sparsity detection component 112 may first determine that a threshold level of sparsity has been exceeded before providing sparsity detection data to state control component 114 and to compensation component 124. For example, below a certain level of sparsity, the additional control processing to disable rows and perform compensation may not result in significant enough power and processing time savings. In some aspects, the input data sparsity threshold may be in the range of 20-30%, but other configurations are possible.

ADCs 120 are generally configured to determine a range of output values, where the range of output values is generally mapped over the input voltage range of the ADC, such as from 0 volts, representing a lowest input value to the ADC, to a supply voltage (e.g., Vdd), representing a highest input value to the ADC.

Because a zero-valued input at a given bit cell may nevertheless correspond to a non-zero voltage contribution at the output of a column of a CIM array and at the input to an ADC, disabling rows that have zero-valued inputs changes the accumulation at the outputs of CIM array 106. To overcome this issue, input data sparsity detection component 112 provides sparsity detection data (e.g., a number of zero-valued input data nodes 130) to compensation component 124, which in this example is part of digital post processing component 122. In other examples, compensation component 124 may be an independent component.

Compensation component 124 is configured to compensate the digital domain output data based on, for example, the number of rows of CIM array 106 that are disabled based on the sparse input data, since the disabled rows have bit cells that would have otherwise contributed to an accumulation at the output of a column of CIM array 106. In this way, CIM array 106 is able to save power during processing by disabling rows without losing accuracy.

In one example, compensation component 124 may determine a MAC adjustment for each column-wise output of CIM array 106 (e.g., via a read bit line), or for each sequential accumulator output, based on a number of disabled rows intersecting the column, according to the following equation:

$$mac_{adj} = mac_{adc} - \left( (N_{rows} - Z_{det}) \times (2^{inpbit-1} - 1) \times (2^{wtbit-1} - 1) \times \frac{cbit}{rbl_{cap}} \times \frac{2^{adcbit}}{adcref} \times \frac{1}{0.5 \times 2^{inpbit} \times 2^{wtbit}} \right), \quad (Eq. 1)$$

where $mac_{adj}$ is the adjustment value accounting for the difference between the actual ADC output ($mac_{adc}$) and the calculated ADC output based on $Z_{det}$; $mac_{adc}$ is the quantized MAC value at the ADC output; $N_{rows}$ is the number of rows in the CIM array; $Z_{det}$ is the number of input data nodes that are zero-valued (which corresponds with the number of rows of CIM array 106 that are disabled); inpbit is the input bit width, wtbit is the weight bit width; cbit is the bit cell capacitance; adcbit is the bit width for the ADC output; adcref is the ADC reference voltage; and $rbl_{cap}$ is the charge domain capacitance. Some of these values may be determined based on physical characteristics of various processing hardware elements making up CIM array 106, and in some cases they may be estimated. Further, $rbl_{cap}$ may be calculated as $N_{rows} \times cbit + cseq + cp$, where $N_{rows}$ is the number of word lines in the CIM array, cseq is the sequential accumulator capacitance (if present), and cp is the parasitic capacitance.

In some aspects, inpbit, wtbit, and adcbit are constant for a given model being processed by CIM architecture 100, so these values may be computed once and stored, for example in registers 128, or another tightly-coupled memory, so that the values may be recalled quickly and efficiently (e.g., in terms of power and processing). These values may then be used for the duration of model processing using CIM architecture 100.

In some aspects, cbit, adcref, and $rbl_{cap}$ are constant at least for a given layer of the model, and thus may be computed once per layer of the model being processing by CIM architecture 100. For example, some of these values may vary based on operating conditions, such as temperature, battery level (of a mobile device), configured use case, etc. These values may likewise be stored in registers 128 for similar reasons.

The remaining variables in Equation 1 are generally updated for every processing cycle of CIM array 106.

Equation 1 may thus be used to compensate digital domain output (e.g., from digital post processing component 122) for disabled rows in CIM array 106 when processing data, such as machine learning model data.

Like input data 102, weight data 108 may also be sparse. As described further with respect to FIGS. 5A-5C, weight data sparsity may be determined and the weight data may be manipulated (e.g., sorted) offline (since the weight data is set after training of a model) to increase possibilities for disabling certain portions of a CIM array (e.g., a tile of a CIM array) for power savings. To this end, tile control 116 may be configured to enable and disable certain tiles of CIM array 106 (e.g., comprising a portion of the bit cells in CIM array 106).

In some implementations, columns of CIM array 106 may be disabled in groups to reduce the hardware necessary to implement the selective enabling and disabling functionality. For example, columns (e.g., associated with bit lines) may be disabled in 32-bit (32 column) groups, however, various implementations are possible based on control and hardware design tradeoffs.

When a column of CIM array 106 (e.g., a bit line) is disabled, compensation component 124 may treat every affected bit cell as disabled, and may therefore calculate a similar compensation value (as in Equation 1, above). This can prevent sequential accumulation from causing errors due to inactive portions of CIM array 106.

Sparsity Detection and Compensation

FIG. 2 depicts an example of input data sparsity detection using aspects of CIM architecture 100 of FIG. 1.

In particular, input data 202 is depicted with example input data values. Input data sparsity detection component 212 determines that two of the input data values, which are eight bit input values in this example, correspond to zero-valued inputs ("00000000"), thus $Z_{det}$ (as in Equation 1, above) is equal to 2. In some cases, input data sparsity detection component 212 may "tag" the zero-valued inputs to keep track of them. For example, the inputs may be tagged with a detection bit configured to be used by state control component 214 to disable the rows associated with the zero-valued input.

Note that detection component 212 may be configured to recognize other patterns for zero-valued input. For example, when bit cells are configured to operate in XNOR, inputs may be converted to odd numbers before processing by CIM array 206. In such a configuration, a value of "10000000" is used by, for example, glue logic (not depicted) to determine that the output is actually "0" and will be counted by sparsity logic.

State control component 214 disables rows (e.g., 203A and 203B) associated with the zero-valued inputs. In some examples, state control component 214 may also be implemented by glue logic (not depicted).

The example depicted in FIG. 2 further includes sequential accumulators inline between a CIM array 206 and an ADC 220. A similar arrangement could be implemented in FIG. 1. Sequential accumulators 219 are connected to the column-wise outputs of CIM array 206 and configured to perform sequential accumulation (e.g., voltage accumulation) across two or more column-wise outputs of CIM array 206 during CIM processing. In some aspects, there is one sequential accumulator connected to each column-wise output of the CIM array (e.g., each read bit line of CIM array 206), and the sequential accumulators can themselves be connected together in order to accumulate across multiple outputs (e.g., accumulate voltage across multiple columns). An example of a read bit line (RBL) for a bit cell, such as may be used in CIM array 206, is depicted in FIG. 4.

In some aspects, two or more serially connected sequential accumulators are connected together and then to an input of another processing block, such as ADC 220 in the depicted example. For example, in an 8-bit example, every eight serial accumulators are connected together (to accumulate across eight column-wise outputs of CIM array 206) and the output of the connected serial accumulators is connected to an ADC (e.g., 220). Note that while a single ADC 220 is depicted in FIG. 2 for simplicity, ADC 220 may be representative of one or more ADCs.

Input data sparsity detection component 212 provides the $Z_{det}$ value to compensation component 224, which applies a compensation to the digital domain output of analog to digital converter 220. In some examples, the compensation value may be calculated as above in Equation 1. The compensated output may then be provided as processed output data 225 (e.g., processed machine learning model data).

Figure 3:
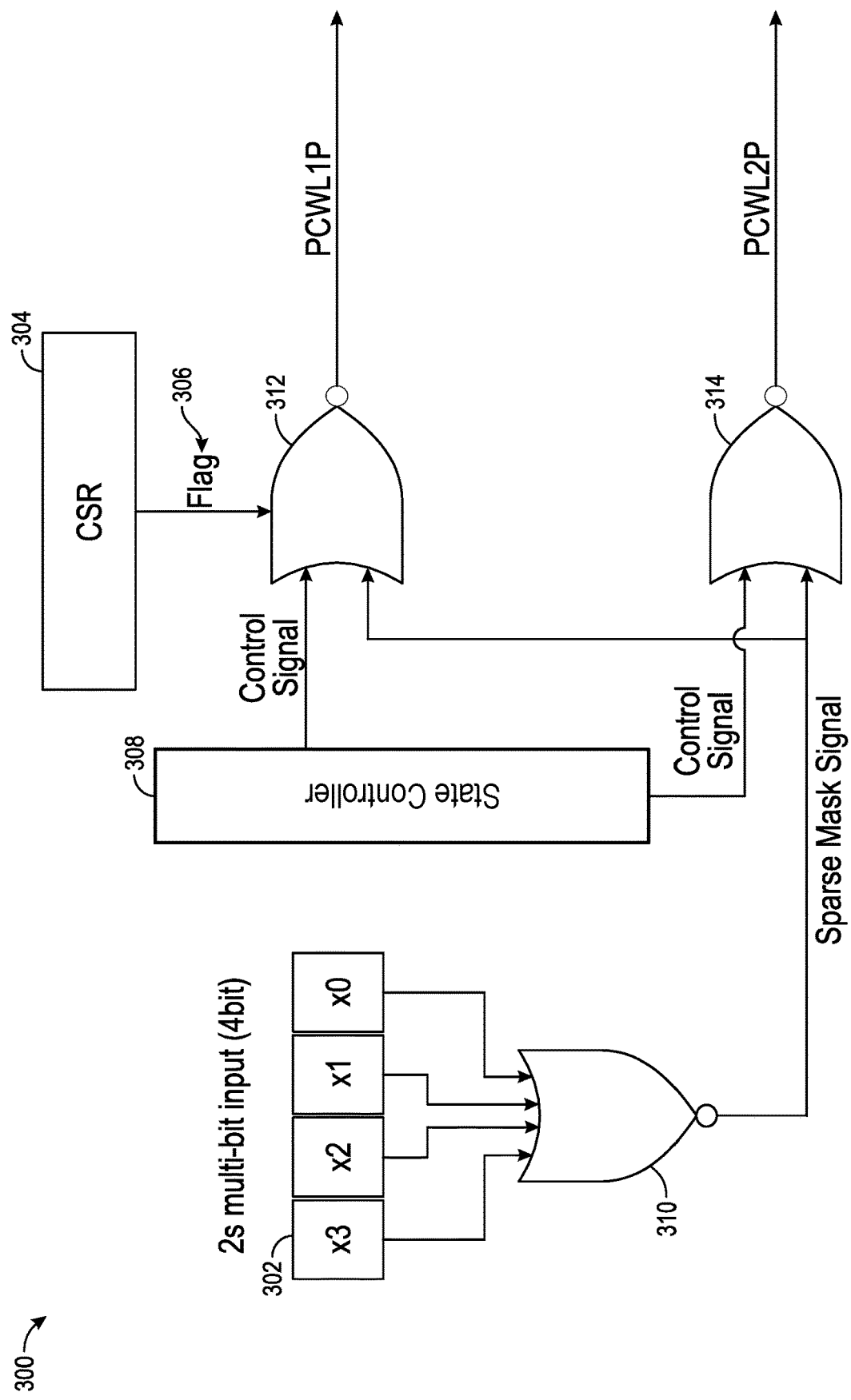
FIG. 3 depicts an example circuit for detecting data sparsity and controlling a bit cell.

FIG. 3 depicts an example circuit 300 for detecting data sparsity and changing a bit cell operation based on detected sparsity. For example, FIG. 3 may be an aspect of input data sparsity detection component 112 in FIG. 1.

In particular, example circuit 300 is configured for detecting sparsity in input data 302, which in this example is multibit (4-bit) data in 2 s complement format.

Control/status register (CSR) 304 is configured to provide an input mode flag 306 to pre-charge word line logic 312 based on whether the input data is binary or multi-bit (as in the depicted example) in order to configure the operation of a connected bit cell (as in FIG. 4).

For example, Table 1, below, illustrates example operational values of a bit cell (such as in FIG. 4) based on the input mode flag value.

TABLE 1

|  | Binary Input | Multibit Input |
| --- | --- | --- |
| Input Mode Flag | 0 | 1 |
| Bit cell Mode | XNOR | AND |

Sparse mask logic 310 (in this example an XNOR gate) is configured to generate a sparse mask signal and provide it as in input to pre-charge word line logic 314. The sparse mask signal acts as an override to change the function of the bit cell (as in FIG. 4) when the input data is sparse. For example, when the input data is zero valued, the sparse mask bit causes both PCWL1P and PCWL2P to be set high to bypass the bit cell. The sparse mask bit is generally valid for an entire multi-bit word. The sparse mask signal may similarly cause a row of a CIM array to be disabled (e.g., tristated).

State controller 308 provides control signals to logic elements 312 and 314 to control the function of a bit cell (such as in FIG. 4). For example, state controller 308 can set the bit cell in a weight write mode where the bit cell is programmed (e.g., a capacitor is charged based on a weight value) or a weight read mode where an input is applied to the weight and the result is transferred to a read bit line.

Example Bit Cell Configuration for CIM Arrays

Bit cells for CIM arrays may generally have certain characteristics, such as isolated read-write paths without read disturb issues and the capability for simultaneous activation of multiple word lines in a bit cell array. If the bit cell is going to be used for conventional memory operations in addition to CIM processing operations, it should support standard write and read operations. However, standard read and write functions are not required if the only function of a bit cell is weight storage and MAC operation. Beneficially, a bit cell for a CIM array may be configured to operate in one of "XNOR" and "AND" operation modes based on, for example, whether the input data is single bit or multi-bit, as discussed above with respect to FIG. 3.

FIG. 4 depicts an example bit cell 400. In one example, bit cell 400 may be used for bit cells 126 in CIM array 106 of FIG. 1.

Bit cell 400 generally comprises a static random access memory (SRAM) cell including a first and second pre-charge word line (PCWL1 402 and PCWL2 404), a read word line (RWL) 406, a read bit line (RBL) 408, a capacitor (CAP) 410, and a latch 412. Note that PCWL1 402 and PCWL2 404 are each connected to a CMOS gate 416 and 418, respectively, and thus 'P' and 'N' characters are used to depict the side of the lines connected to PMOS and NMOS transistors, respectively. Table 2, below, depicts operational values for bit cell 400 given different weight values being written to bit cell 400:

TABLE 2

| Weight | PCWL1P | PCWL2P | RWL |
| --- | --- | --- | --- |
| 0 | 0 | 1 | 1 |
| 1 | 1 | 0 | 1 |

Bit cell 400 may be operated in different modes based on the type of input data. For example, bit cell 400 may be configured to operate in an "AND" operation mode for multibit input data, which can natively support 2 s complement input data format, such as in the example of FIG. 3. For binary input data, bit cell 400 may be configured to operate in an XNOR operation mode. The operating mode of bit cell 400 can be selected, for example, by a control/status register (CSR) (such as in FIG. 3) set by a memory control unit (MCU) or the like. For example, "AND" mode may be activated by tying PCWL1P of bit cell 400 high.

Table 3, below, depicts operational states of bit cell 400 in both "AND" and "XNOR" operating modes.

TABLE 3

| Input | | | |
|---|---|---|---|
| A PCWL1P PCWL2P | B Latch 412 | Output A AND B | Output A XNOR B |
| 0 | 0 | 0 | 1 |
| 0 | 1 | 0 | 0 |
| 1 | 0 | 0 | 0 |
| 1 | 1 | 1 | 1 |

Notably the "AND" operational mode consume less power since bit cell 400 stops charging capacitor 410 when multibit input is "0". By contrast, bit cell "XNOR" operations consume more power when the input is "0" since bit cell keeps 400 continues charging capacitor 410 from the stored weight.

Sparsity detection (e.g., input data sparsity detection component 112 of FIG. 1) and control logic (e.g., state control component 114 of FIG. 1) can help reduce power use by bit cell 400 when operating in "XNOR" mode by disabling (e.g., tristating) bit cell 400, for example, by tying PCWL1P and PCWL2P high when the input data is 0. Similarly, when in the "AND" mode, the control logic may generate a sparse mask signal (e.g., as in FIG. 3), which likewise bypasses bit cell 400 by tying PCWL1P and PCWL2P high for the entire multibit input.

The operational mode of bit cell 400 (e.g., "XNOR" (binary) mode or "AND" (multibit) mode) may be set per layer of a machine learning model in some aspects.

Notably, FIG. 4 depicts an example bit cell 400, but other bit cell configurations may be used consistent with aspects described herein.

Weight Sparseness Sorting and Tiling

Like input data, machine learning model weight data often exhibits sparseness (e.g., weight values being 0 or near 0). For example, weight sparseness can be the result of adding L1 normalization to a loss function during training to discourage model overfitting. Detecting weight sparseness can be particularly useful given "weight stationary" parallel processing is a significant benefit of CIM processing.

Weight data can be sorted row-by-row and column-by-column (including multibit column groups) offline based on the number of sparse weights occurring in the rows and columns (or multibit column groups). The sorted weight data can then be loaded into a CIM array (e.g., 106 in FIG. 1) such that the dense weight rows and columns are gathered together and the sparse rows and columns are gathered together. This grouping may allow for areas of the CIM array (e.g., "tiles") to be disabled to save power. For example, CIM tiles with all zero-valued weights may be disabled to save processing power and processing time (e.g., by saving weight loading cycle time).

Input data may be likewise rearranged to match the rearranged weights. For example, the input data may be rearranged according to a sorted row sequence index.

After processing the rearranged data in the CIM array, the CIM/ADC output may be rearranged once again to revert back to the original sequence.

Generally, the more granular the control over CIM array tiles (e.g., higher granularity gives control over smaller tiles), the more overhead logic may be necessary to control the state of each tile (e.g., by tile control 116 in FIG. 1). This overhead logic requires additional power and processing time that reduces the power and processing time savings from disabling tiles based on weight sparsity. Accordingly, various implementations may strike different balances of granularity versus circuit design constraints depending on desired performance characteristics, model characteristics, and the like.

Figure 5A:
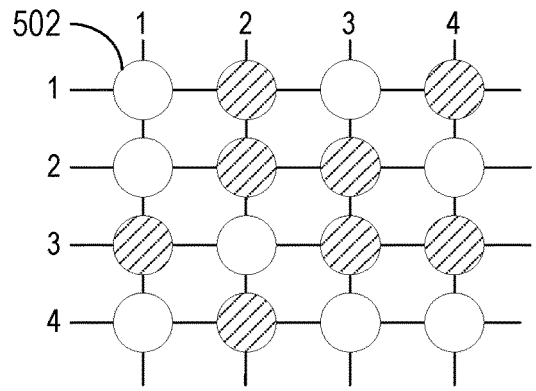
FIGS. 5A-5C depict an example of row and column sorting of weight data.
Figure 5B:
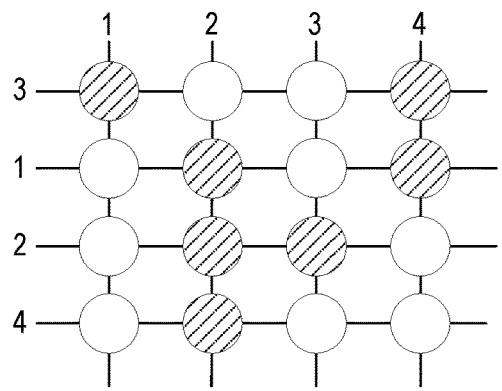
Figure 5C:
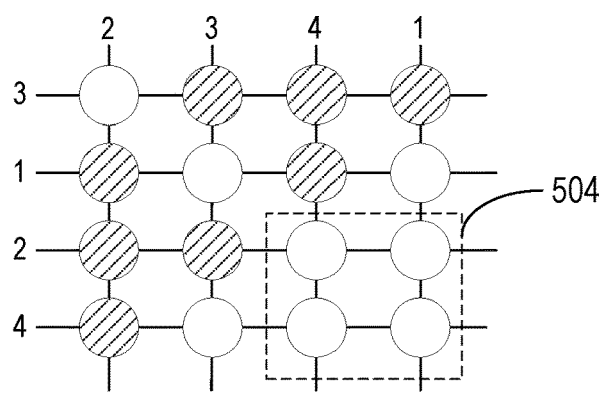

FIGS. 5A-5C depict an example of row and column sorting of weight data. In these examples, assume that the minimum disableable tile size is 2 rows by 2 columns, covering 4 bit cells.

In particular, FIG. 5A depicts an example CIM array 500 with 16 bit cells (e.g., bit cell 502). In this example, there are no possible tiles that can be disabled.

In FIG. 5B, the rows have been sorted according to density, with the highest density rows (i.e., those with more non-zero weights) at the top of the CIM array and the lowest at the bottom. Notably, there are still no tiles that can be disabled.

In FIG. 5C, the columns have further been sorted according to density, with the highest density columns at the left of the CIM array and the lowest at the right. Here, there is a tile 504 that may be disabled based on the sorting.

In some cases, weight sorting may be performed layer-by-layer for a model and the resulting sequences can be stored, for example, in registers (e.g., registers 128 in FIG. 1), such as control/status registers (CSR).

Note that FIGS. 5A-5C depict just one example, and many others are possible. In particular, for larger CIM arrays having many more bit cells, there may be many additional opportunities for disabling tiles based on sorting compared to this simple example.

Figure 6:
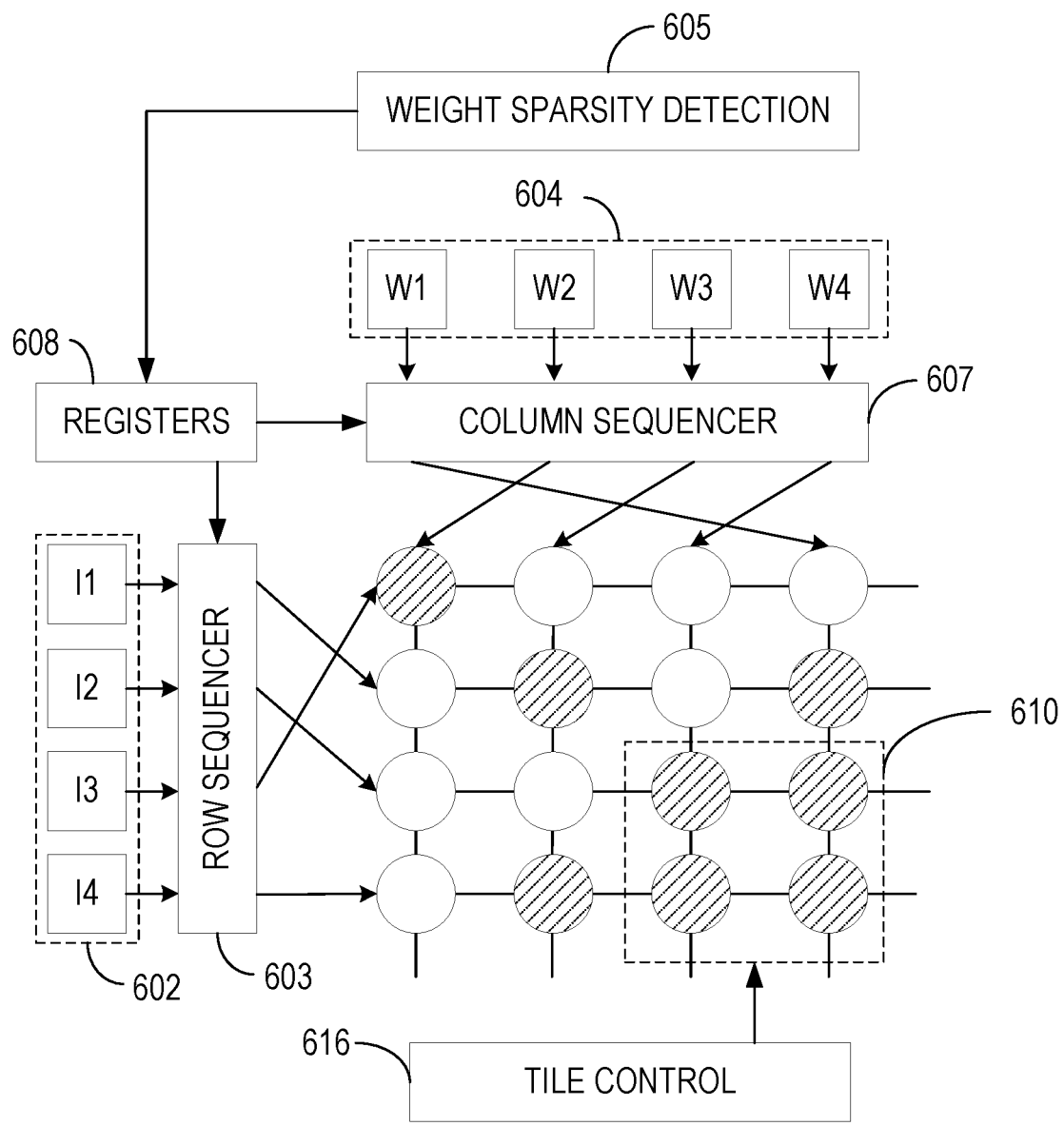
FIG. 6 depicts another example of weight sparsity detection and sequencing of weight data to generate tiles that can be disabled in a CIM array.

FIG. 6 depicts another example of weight sparsity detection and sequencing of weight data to generate tiles that can be disabled in a CIM array.

In particular, weight data 604 may be analyzed by a weight data sparsity detection component 605, which may be further configured to provide sequencing for rows and columns to registers 608 (or another memory). Then, row sequencer 603 and column sequencer 607 may implement the sequence when loading weight data into the CIM array. Note that weight data sparsity detection component 605 may represent an offline process in some aspects.

In some cases, row sequencer 603 and column sequencer 607 may be implemented in glue logic.

As depicted in the example, input data 602 may be applied to the resequenced weights according to the resequenced weight data according to column sequencer 607 and row sequencer 603.

In some cases, resequencing weight data based on weight data sparsity, as described with respect to FIGS. 5A-5C and 6 is only performed if the weight data sparsity exceeds a threshold. For example, below a certain threshold, it may be unlikely that resequencing the weight data will result in disableable tiles, and thus the power and processing time associated with the resequencing can be avoided. In some aspects, the weight data sparsity threshold may be in the range of 20-30%, but other configurations are possible.

As in the example of FIG. 5C, here tile 610 can be disabled (e.g., by tile control 616), which saves power during processing with the CIM array.

Weight Compression/Decompression

A benefit of weight sparsity detection is that compressed weights can be stored and decompressed as needed for model processing.

For example, after detecting sparse (e.g., zero-valued weights or near-zero valued weights), only the non-zero-valued weights may then be stored with column and row reference numbers in a memory (e.g., in registers 608 of FIG. 6). The zero-valued weights can be added during weight decompression, for example by column sequencer 607 and row sequencer 603 in FIG. 6. Omitting the zero-valued weights allows for saving memory bandwidth, reducing the necessary memory size, and saves power and time in moving weights from memory to the CIM array.

Figure 7:
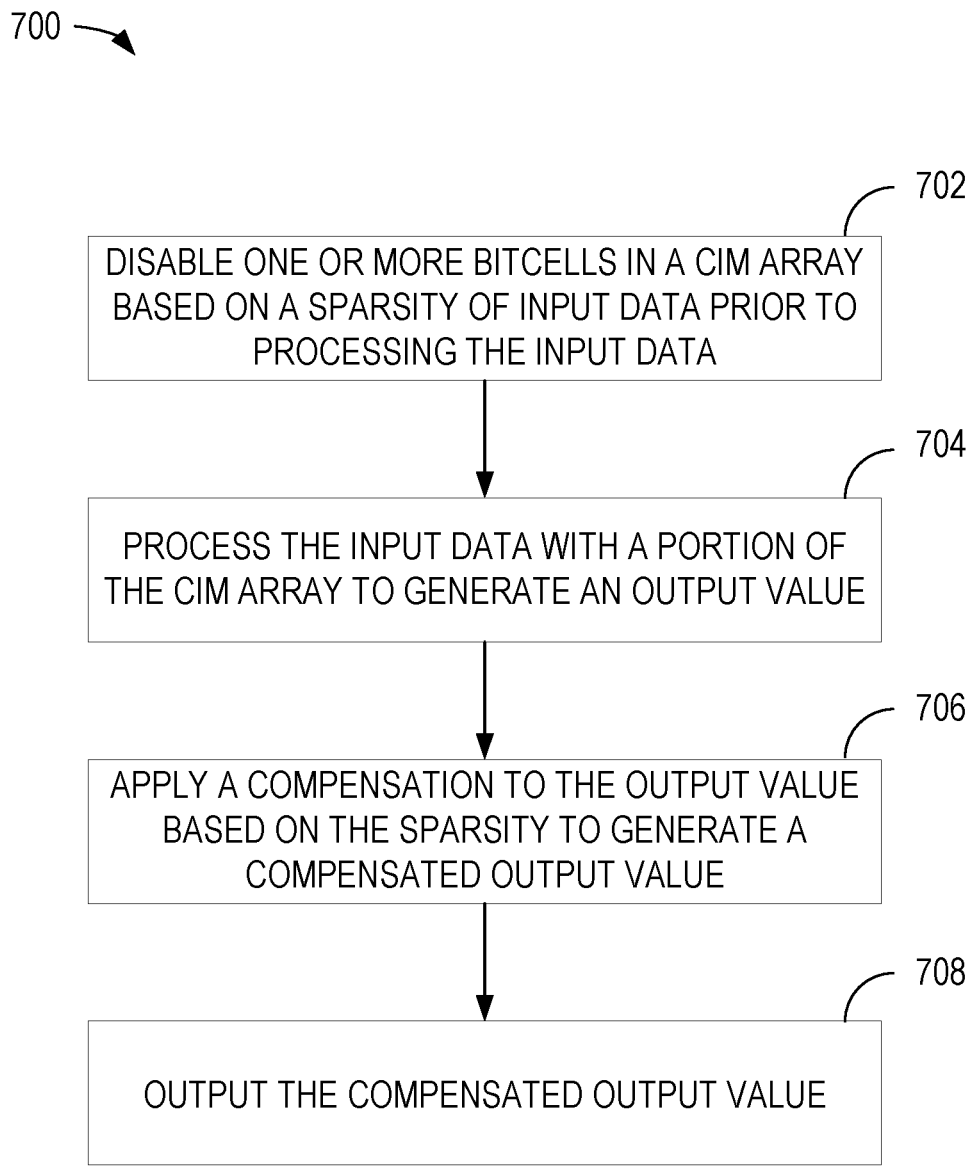
FIG. 7 depicts an example method for performing machine learning computations in a CIM array.

Example Method of Performing Sparsity-Aware Machine Learning Computations in a CIM Array FIG. 7 depicts an example method for performing machine learning computations in a compute-in-memory (CIM) array.

Method 700 begins at step 702 with disabling one or more bit cells in a CIM array based on the sparsity of the input data prior to processing the input data. In some aspects, one or more rows of bit cells may be disabled.

For example, a state control component (e.g., 114 in FIG. 1 and 214 in FIG. 2) may be configured to disable word lines (rows) in a CIM array, thereby disabling all bit cells in the disabled row. As above, in some cases, the state control component may be implemented in glue logic. In other cases, a circuit such as that described with respect to FIG. 3 may be used to send appropriate signals to a bit cell to disable it.

In some cases, disabling the one or more bit cells in the CIM array based on the sparsity of the input data prior to processing the input data comprises disabling each row (e.g., one or more associated word lines) of the CIM array for which an associated activation input value is 0, such as depicted in the example in FIG. 2.

Method 700 then proceeds to step 704 with processing the input data with a portion of the CIM array to generate an output value. The portion of the CIM array generally includes bit cells that are not disabled, for example, in step 704, or other steps as described herein (for example, relating to a disabled tile based on weight data sparsity).

Method 700 then proceeds to step 706 with applying a compensation to the output value based on the sparsity to generate a compensated output value. For example, the compensation to the output value may be based on a count of activation inputs in the input data with an activation input value of 0.

In some aspects, a compensation component (e.g., 124 in FIG. 1 and 224 in FIG. 2) may be used to apply the compensation value. In some cases, the compensation component may be a sub-component of a digital post processing component, configured to process digital domain data after an ADC coverts the CIM array output from the analog domain to the digital domain.

In some cases, applying a compensation to the output value comprises determining and applying a $mac_{adj}$ compensation values, such as described with respect to Equation 1, above.

Method 700 then proceeds to step 708 with outputting the compensated output value.

Though not depicted in FIG. 7, method 700 may further include determining that a sparsity of input data to a machine learning model exceeds an input data sparsity threshold (e.g., prior to performing step 702).

For example, an input data sparsity detection component (e.g., 112 in FIG. 1 and 212 in FIG. 2) may determine the sparsity and compare it to a threshold. In some cases, a circuit such as that described with respect to FIG. 3 may be used to detect the sparsity.

In some cases, determining the sparsity of the input data may comprise determining a count of activation inputs in the input data with an activation input value of 0. Note that an activation function may be applied to the output at a later stage, such as in an activation function implemented by digital post processing component 122 in FIG. 1.

For example, the input data sparsity detection component, such as described with respect to FIGS. 1 and 2, may determine the count (e.g., $Z_{det}$) of input data nodes (e.g., 130 in FIG. 1) with a sparse activation input value, such as an activation input value of 0 in certain examples. This count may be compared to an overall number of input data nodes to determine a sparsity of the input data.

Though not depicted in FIG. 7, method 700 may further include determining whether the input data comprises binary input data or multibit input data; setting bit cells of the CIM array to an AND operation mode if the input data comprises multibit input data; and setting bit cells of the CIM array to an XNOR operation mode if the input data comprises binary input data. For example, the operational mode of the bit cells may be configured as described with respect to FIG. 4.

Though not depicted in FIG. 7, method 700 may further include determining that a sparsity of weight data for the machine learning model exceeds a weight data sparsity threshold; resequencing the weight data according to sparsity; disabling one or more bit cells in the CIM array based on the resequenced weight data; and resequencing the input data based on the resequenced weight data, such as described with respect to FIGS. 5A-5C and 6. For example, the one or more bit cells may be in a tile of a CIM array. In some aspects, weight data sparsity detection is performed offline.

In some aspects, row sequencer 603 and column sequencer 607 may be configured to resequence the weight data according to the detected sparsity. Further, tile control 116 in FIG. 1 may be configured to disable one or more tiles of bit cells (each comprising one or more bit cells) in the CIM array.

In some cases, resequencing the weight data according to sparsity comprises: resequencing rows of a CIM array weight matrix according to a sparsity of each row in the CIM array weight matrix; and resequencing columns of the CIM array weight matrix according to a sparsity of each column in the CIM array weight matrix, as described with respect to the example of FIGS. 5A-5C.

In some cases, disabling one or more bit cells in the CIM array based on the resequenced weight data comprises disabling one or more tiles of bit cells, wherein each tile of the one or more tiles comprises a plurality of bit cells with weight values of 0, such as depicted in FIGS. 5C and 6.

In some cases, the resequenced weight data may be compressed by removing any weight with a value of 0, and the compressed resequenced weight data may be stored in a memory, such as registers 128 in FIG. 1 and registers 608 of FIG. 6, or another system memory.

Though not depicted in FIG. 7, method 700 may further include: retrieving the compressed resequenced weight data from the memory; decompressing the compressed resequenced weight data; and writing the decompressed resequenced weight data to the CIM array prior to processing the input data with the portion of the CIM array to generate the output value.

Figure 8:
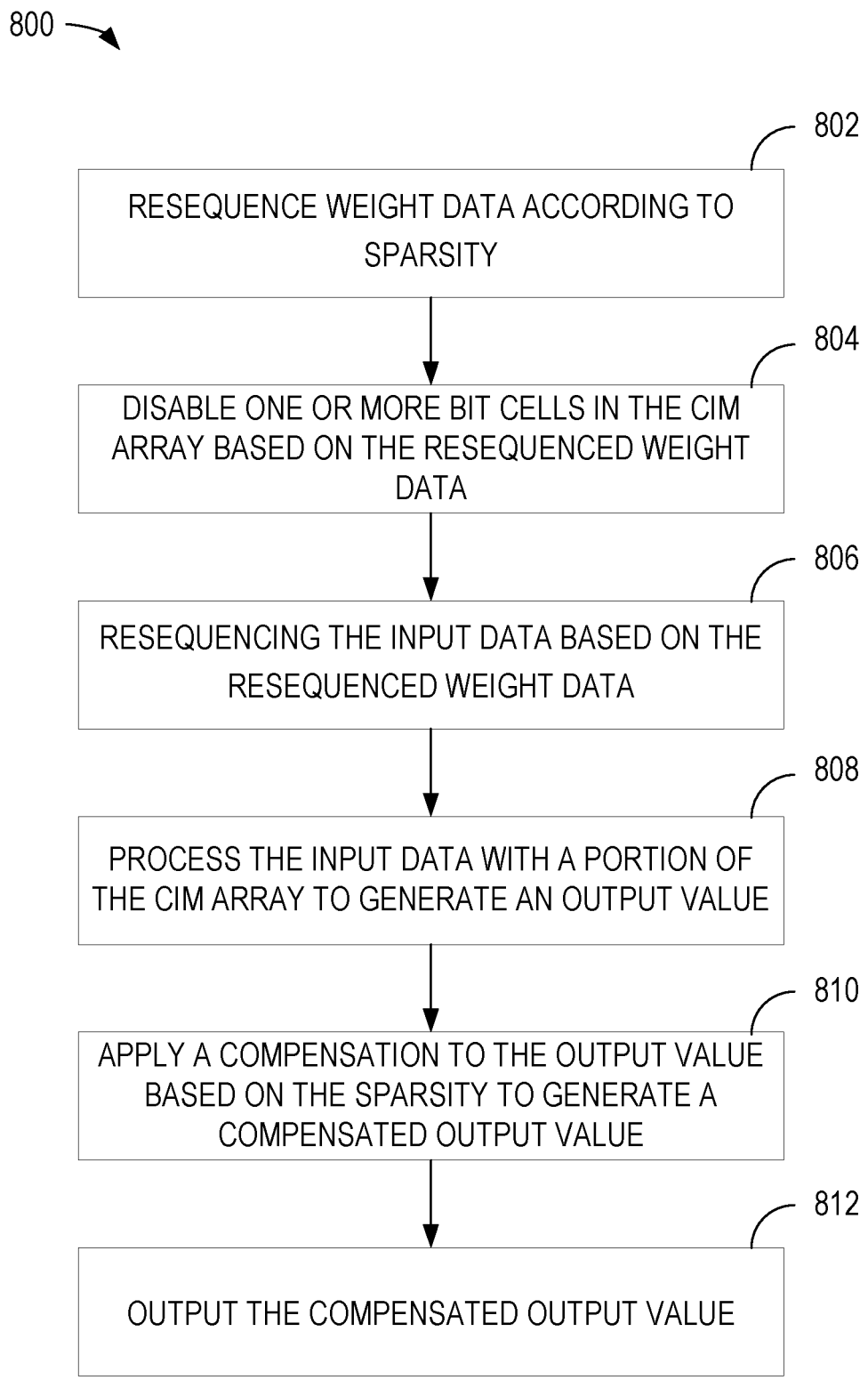
FIG. 8 depicts another example method for performing machine learning computations in a compute-in-memory (CIM) array.

FIG. 8 depicts another example method for performing machine learning computations in a compute-in-memory (CIM) array.

Method 800 begins at step 802 with resequencing the weight data according to sparsity. For example, row sequencer 603 and column sequencer 607 of FIG. 6 may be configured to resequence the weight data according to the detected sparsity.

In some cases, resequencing the weight data according to sparsity comprises: resequencing rows of a CIM array weight matrix according to a sparsity of each row in the CIM array weight matrix; and resequencing columns of the CIM array weight matrix according to a sparsity of each column in the CIM array weight matrix, as described with respect to the example of FIGS. 5A-5C.

Method 800 then proceeds to step 804 with disabling one or more bit cells in the CIM array based on the resequenced weight data. For example, tile control 116 in FIG. 1 or 616 in FIG. 6 may disable the one or more bit cells in the CIM array, such as the tile of bit cells 610 depicted in FIG. 6.

In some cases, disabling one or more bit cells in the CIM array based on the resequenced weight data comprises disabling one or more tiles of bit cells, wherein each tile of the one or more tiles comprises a plurality of bit cells with weight values of 0, such as depicted in FIGS. 5C and 6.

Method 800 then proceeds to step 806 with resequencing the input data based on the resequenced weight data, such as described with respect to FIGS. 5A-5C and 6.

In some cases, the resequenced weight data may be compressed by removing any weight with a value of 0, and the compressed resequenced weight data may be stored in a memory, such as registers 128 in FIG. 1 and registers 608 of FIG. 6, or another system memory.

Method 800 then proceeds to step 808 with processing the input data with a portion of the CIM array to generate an output value. The portion of the CIM array generally includes bit cells that are not disabled, for example, in step 806.

Method 800 then proceeds to step 810 with applying a compensation to the output value based on the sparsity to generate a compensated output value. For example, the compensation may be based on a number of rows (or word lines), columns (or bit lines), and/or bit cells that can be disabled based on the resequenced weight and input data, such as depicted in FIG. 5C.

Method 800 then proceeds to step 812 with outputting the compensated output value.

Though not depicted in FIG. 8, method 800 may further include determining that a sparsity of weight data for a machine learning model exceeds a weight data sparsity threshold.

Though not depicted in FIG. 8, method 800 may further include retrieving the compressed resequenced weight data from the memory; decompressing the compressed resequenced weight data; and writing the decompressed resequenced weight data to the CIM array prior to processing the input data with the portion of the CIM array to generate the output value.

Example Processing System for Performing Sparsity Aware Compute-In-Memory

Figure 9:
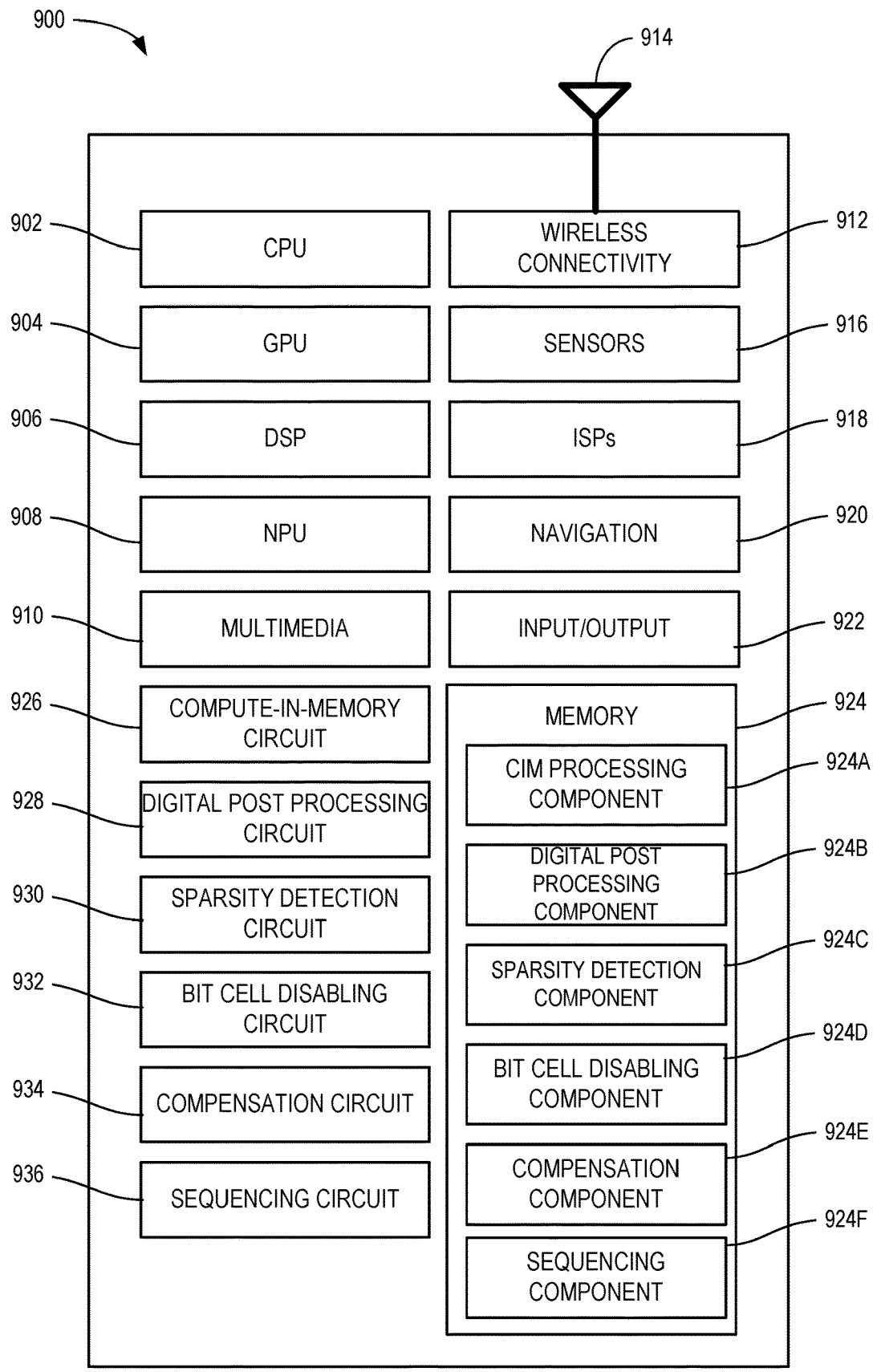
FIG. 9 depicts an example processing system for performing sparsity-aware compute-in-memory.

FIG. 9 depicts an example processing system 900 for performing sparsity-aware compute-in-memory, such as described herein for example with respect to FIGS. 1-7.

Processing system 900 includes a central processing unit (CPU) 902, which in some examples may be a multi-core CPU. Instructions executed at the CPU 902 may be loaded, for example, from a program memory associated with the CPU 902 or may be loaded from a memory partition 924.

Processing system 900 also includes additional processing components tailored to specific functions, such as a graphics processing unit (GPU) 904, a digital signal processor (DSP) 906, a neural processing unit (NPU) 908, a multimedia processing unit 910, and a wireless connectivity component 912.

An NPU, such as 908, is generally a specialized circuit configured for implementing all the necessary control and arithmetic logic for executing machine learning algorithms, such as algorithms for processing artificial neural networks (ANNs), deep neural networks (DNNs), random forests (RFs), and the like. An NPU may sometimes alternatively be referred to as a neural signal processor (NSP), tensor processing units (TPU), neural network processor (NNP), intelligence processing unit (IPU), vision processing unit (VPU), or graph processing unit.

NPUs, such as 908, are configured to accelerate the performance of common machine learning tasks, such as image classification, machine translation, object detection, and various other predictive models. In some examples, a plurality of NPUs may be instantiated on a single chip, such as a system on a chip (SoC), while in other examples they may be part of a dedicated neural-network accelerator.

NPUs may be optimized for training or inference, or in some cases configured to balance performance between both. For NPUs that are capable of performing both training and inference, the two tasks may still generally be performed independently.

NPUs designed to accelerate training are generally configured to accelerate the optimization of new models, which is a highly compute-intensive operation that involves inputting an existing dataset (often labeled or tagged), iterating over the dataset, and then adjusting model parameters, such as weights and biases, in order to improve model performance. Generally, optimizing based on a wrong prediction involves propagating back through the layers of the model and determining gradients to reduce the prediction error.

NPUs designed to accelerate inference are generally configured to operate on complete models. Such NPUs may thus be configured to input a new piece of data and rapidly process it through an already trained model to generate a model output (e.g., an inference).

In one implementation, NPU 908 is a part of one or more of CPU 902, GPU 904, and/or DSP 906.

In some examples, wireless connectivity component 912 may include subcomponents, for example, for third generation (3G) connectivity, fourth generation (4G) connectivity (e.g., 4G LTE), fifth generation connectivity (e.g., 5G or NR), Wi-Fi connectivity, Bluetooth connectivity, and other wireless data transmission standards. Wireless connectivity processing component 912 is further connected to one or more antennas 914.

Processing system 900 may also include one or more sensor processing units 916 associated with any manner of sensor, one or more image signal processors (ISPs) 918 associated with any manner of image sensor, and/or a navigation processor 920, which may include satellite-based positioning system components (e.g., GPS or GLONASS) as well as inertial positioning system components.

Processing system 900 may also include one or more input and/or output devices 922, such as screens, touch-sensitive surfaces (including touch-sensitive displays), physical buttons, speakers, microphones, and the like.

In some examples, one or more of the processors of processing system 900 may be based on an ARM or RISC-V instruction set.

Processing system 900 also includes memory 924, which is representative of one or more static and/or dynamic memories, such as a dynamic random access memory, a flash-based static memory, and the like. In this example, memory 924 includes computer-executable components, which may be executed by one or more of the aforementioned processors of processing system 900.

In particular, in this example, memory 924 includes CIM processing component 924A, digital post processing component 924B, sparsity detection component 924C, bit cell disabling component 924D, compensation component 924E, and sequencing component 924F. The depicted components, and others not depicted, may be configured to perform various aspects of the methods described herein.

Processing system 900 further comprises compute-in-memory (CIM) circuit 926, such as described above, for example, with respect to FIG. 1. Further, the bit cells depicted in FIG. 1 may be as described in FIG. 4.

Processing system 900 further comprises digital post processing circuit 928, such as described above with respect to FIG. 1.

Processing system 900 further comprises sparsity detection circuit 930, such as described above, for example, with respect to FIGS. 1, 2, 3, and 6. For example, sparsity detection circuit may be configured to detect sparsity in input data and/or weight data, as described above. In some cases, a separate circuit may be used for input data sparsity detection and for weight data sparsity detection.

Processing system 900 further comprises bit cell disabling circuit 932, such as described above, for example, with respect to FIGS. 1, 2 and 3. For example, bit cell disabling circuit may be configured to disable rows (word lines) of a CIM array, columns (bit lines) of a CIM array, and/or tiles of a CIM array comprising multiple bit cells.

Processing system 900 further comprises compensation circuit 934, such as described above, for example, with respect to FIG. 1.

Processing system 900 further comprises sequencing circuit 934, such as described above, for example, with respect to FIGS. 5A-5C and 6.

Though depicted as separate circuit for clarity in FIG. 9, circuits 926, 928, 930, 932, 934, and 936 may collectively or individually be implemented in other processing devices of processing system 900, such as within CPU 902, GPU 904, DSP 906, NPU 908, and the like.

Generally, processing system 900 and/or components thereof may be configured to perform the methods described herein.

Notably, in other cases, aspects of processing system 900 may be omitted, such as where processing system 900 is a server computer or the like. For example, multimedia component 910, wireless connectivity 912, sensors 916, ISPs 918, and/or navigation component 920 may be omitted in other aspects. Further, aspects of processing system 900 maybe distributed between multiple devices.

Example Clauses

Implementation examples are described in the following numbered clauses:

Clause 1: A method, comprising: disabling one or more bit cells in a compute-in-memory (CIM) array based on a sparsity of input data for a machine learning model prior to processing the input data; processing the input data with bit cells not disabled in the CIM array to generate an output value; applying a compensation to the output value based on the sparsity of the input data to generate a compensated output value; and outputting the compensated output value.

Clause 2: The method of claim 1, wherein disabling one or more bit cells in the CIM array based on the sparsity of the input data prior to processing the input data comprises disabling each row of the CIM array for which an associated activation input value is 0.

Clause 3: The method of any one of Clauses 1-2, wherein the compensation is applied in a digital domain.

Clause 4: The method of any one of Clauses 1-3, further comprising: determining whether the input data comprises binary input data or multibit input data; setting bit cells of the CIM array to an AND operation mode if the input data comprises multibit input data; and setting bit cells of the CIM array to an XNOR operation mode if the input data comprises binary input data.

Clause 5: The method of any one of Clauses 1-4, further comprising: determining that a sparsity of weight data for the machine learning model exceeds a weight data sparsity threshold; resequencing the weight data according to the sparsity of the weight data; disabling one or more bit cells in the CIM array based on the resequenced weight data; and resequencing the input data based on the resequenced weight data.

Clause 6: The method of Clause 5, wherein resequencing the weight data according to the sparsity of the weight data comprises: resequencing rows of a CIM array weight matrix according to a sparsity of each row in the CIM array weight matrix; and resequencing columns of the CIM array weight matrix according to a sparsity of each column in the CIM array weight matrix.

Clause 7: The method of Clause 6, wherein disabling one or more bit cells in the CIM array based on the resequenced weight data comprises disabling one or more tiles of bit cells, wherein each tile of the one or more tiles comprises a plurality of bit cells with weight values of 0.

Clause 8: The method of Clause 5, further comprising: compressing the resequenced weight data by removing any weight with a value of 0; and storing the compressed resequenced weight data in a memory.

Clause 9: The method of Clause 8, further comprising: retrieving the compressed resequenced weight data from the memory; decompressing the compressed resequenced weight data; and writing the decompressed resequenced weight data to the CIM array prior to processing the input data with the bit cells not disabled in the CIM array to generate the output value.

Clause 10: The method of any one of Clauses 1-9, wherein determining the sparsity of the input data comprises determining a count of activation inputs in the input data with an activation input value of 0.

Clause 11: The method of any one of Clauses 1-10, further comprising determining that the sparsity of the input data to the machine learning model exceeds an input data sparsity threshold.

Clause 12: A method, comprising: resequencing weight data for a machine learning model according to sparsity; disabling one or more bit cells in a compute-in-memory (CIM) array based on the resequenced weight data; resequencing input data based on the resequenced weight data; processing the input data with bit cells not disabled in the CIM array to generate an output value; applying a compensation to the output value based on the sparsity to generate a compensated output value; and outputting the compensated output value.

Clause 13: The method of Clause 12, wherein: disabling one or more bit cells in the CIM array based on the resequenced weight data comprises disabling one or more tiles of bit cells, and each tile of the one or more tiles comprises a plurality of bit cells with weight values of 0.

Clause 14: The method of any one of Clauses 12-13, further comprising: compressing the resequenced weight data by removing any weight with a value of 0; and storing the compressed resequenced weight data in a memory.

Clause 15: The method of Clause 14, further comprising: retrieving the compressed resequenced weight data from the memory; decompressing the compressed resequenced weight data; and writing the decompressed resequenced weight data to the CIM array prior to processing the input data with bit cells not disabled in the CIM array to generate the output value.

Clause 16: The method of any one of Clauses 12-15, further comprising determining that a sparsity of weight data for the machine learning model exceeds a weight data sparsity threshold.

Clause 17: A processing system, comprising: a memory comprising computer-executable instructions; and one or more processors configured to execute the computer-executable instructions and cause the processing system to perform a method in accordance with any one of Clauses 1-16.

Clause 18: A processing system, comprising means for performing a method in accordance with any one of Clauses 1-16.

Clause 19: A non-transitory computer-readable medium comprising computer-executable instructions that, when executed by one or more processors of a processing system, cause the processing system to perform a method in accordance with any one of Clauses 1-16.

Clause 20: A computer program product embodied on a computer-readable storage medium comprising code for performing a method in accordance with any one of Clauses 1-16.

Additional Considerations

The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the generic principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A method, comprising:
   disabling one or more bit cells in a compute-in-memory (CIM) array based on a sparsity of input data for a machine learning model prior to processing the input data;
   determining that a sparsity of weight data for the machine learning model exceeds a weight data sparsity threshold;
   resequencing the weight data according to the sparsity of the weight data;

disabling one or more bit cells in the CIM array based on the resequenced weight data;
resequencing the input data based on the resequenced weight data;
processing the input data with bit cells not disabled in the CIM array to generate an output value;
applying a compensation to the output value based on the sparsity of the input data to generate a compensated output value; and
outputting the compensated output value.

2. The method of claim 1, wherein disabling one or more bit cells in the CIM array based on the sparsity of the input data prior to processing the input data comprises disabling each row of the CIM array for which an associated activation input value is 0.

3. The method of claim 1, wherein the compensation is applied in a digital domain.

4. The method of claim 1, further comprising:
determining whether the input data comprises binary input data or multibit input data;
setting bit cells of the CIM array to an AND operation mode if the input data comprises multibit input data; and
setting bit cells of the CIM array to an XNOR operation mode if the input data comprises binary input data.

5. The method of claim 1, wherein resequencing the weight data according to the sparsity of the weight data comprises:
resequencing rows of a CIM array weight matrix according to a sparsity of each row in the CIM array weight matrix; and
resequencing columns of the CIM array weight matrix according to a sparsity of each column in the CIM array weight matrix.

6. The method of claim 5, wherein disabling one or more bit cells in the CIM array based on the resequenced weight data comprises disabling one or more tiles of bit cells, wherein each tile of the one or more tiles comprises a plurality of bit cells with weight values of 0.

7. The method of claim 1, further comprising:
compressing the resequenced weight data by removing any weight with a value of 0; and
storing the compressed resequenced weight data in a memory.

8. The method of claim 7, further comprising:
retrieving the compressed resequenced weight data from the memory;
decompressing the compressed resequenced weight data; and
writing the decompressed resequenced weight data to the CIM array prior to processing the input data with the bit cells not disabled in the CIM array to generate the output value.

9. The method of claim 1, wherein determining the sparsity of the input data comprises determining a count of activation inputs in the input data with an activation input value of 0.

10. The method of claim 1, further comprising determining that the sparsity of the input data to the machine learning model exceeds an input data sparsity threshold.

11. A method, comprising:
resequencing weight data for a machine learning model according to a sparsity of the weight data, wherein the sparsity of the weight data exceeds a weight data sparsity threshold;
disabling one or more bit cells in a compute-in-memory (CIM) array based on the resequenced weight data;
resequencing input data based on the resequenced weight data;
processing the input data with bit cells not disabled in the CIM array to generate an output value;
applying a compensation to the output value based on the sparsity to generate a compensated output value; and
outputting the compensated output value.

12. The method of claim 11, wherein:
disabling one or more bit cells in the CIM array based on the resequenced weight data comprises disabling one or more tiles of bit cells, and
each tile of the one or more tiles comprises a plurality of bit cells with weight values of 0.

13. The method of claim 11, further comprising:
compressing the resequenced weight data by removing any weight with a value of 0; and
storing the compressed resequenced weight data in a memory.

14. The method of claim 13, further comprising:
retrieving the compressed resequenced weight data from the memory;
decompressing the compressed resequenced weight data; and
writing the decompressed resequenced weight data to the CIM array prior to processing the input data with bit cells not disabled in the CIM array to generate the output value.

15. A processing system, comprising:
a memory comprising computer-executable instructions; and
one or more processors configured to execute the computer-executable instructions and cause the processing system to:
disable one or more bit cells in a compute-in-memory (CIM) array based on a sparsity of input data for a machine learning model prior to processing the input data;
determine that a sparsity of weight data for the machine learning model exceeds a weight data sparsity threshold;
resequence the weight data according to the sparsity of the weight data;
disable one or more bit cells in the CIM array based on the resequenced weight data;
resequence the input data based on the resequenced weight data;
process the input data with bit cells not disabled in the CIM array to generate an output value;
apply a compensation to the output value based on the sparsity of the input data to generate a compensated output value; and
output the compensated output value.

16. The processing system of claim 15, wherein in order to disable one or more bit cells in the CIM array based on the sparsity of the input data prior to processing the input data, the one or more processors are further configured to disable each word line of the CIM array for which an associated activation input value is 0.

17. The processing system of claim 15, wherein the compensation is applied in a digital domain.

18. The processing system of claim 15, wherein the one or more processors are further configured to:
determine whether the input data comprises binary input data or multibit input data;
set bit cells of the CIM array to an AND operation mode if the input data comprises multibit input data; and set bit cells of the CIM array to an XNOR operation mode if the input data comprises binary input data.

19. The processing system of claim 15, wherein in order to resequence the weight data according to the sparsity of the weight data, the one or more processors are further configured to:
resequence rows of a CIM array weight matrix according to a sparsity of each row in the CIM array weight matrix; and
resequence columns of the CIM array weight matrix according to a sparsity of each column in the CIM array weight matrix.

20. The processing system of claim 19, wherein in order to disable one or more bit cells in the CIM array based on the resequenced weight data, the one or more processors are further configured to disable one or more tiles of bit cells, wherein each tile of the one or more tiles comprises a plurality of bit cells with weight values of 0.

21. The processing system of claim 15, wherein the one or more processors are further configured to:
compress the resequenced weight data by removing any weight with a value of 0; and
store the compressed resequenced weight data in a memory.

22. The processing system of claim 21, wherein the one or more processors are further configured to:
retrieve the compressed resequenced weight data from the memory;
decompress the compressed resequenced weight data; and
write the decompressed resequenced weight data to the CIM array prior to processing the input data with the bit cells not disabled in the CIM array to generate the output value.

23. The processing system of claim 15, wherein in order to determine the sparsity of the input data, the one or more processors are further configured to determine a count of activation inputs in the input data with an activation input value of 0.

24. The processing system of claim 15, wherein the one or more processors are further configured to determine that the sparsity of the input data to the machine learning model exceeds an input data sparsity threshold.

25. A processing system, comprising:
a memory comprising computer-executable instructions; and
one or more processors configured to execute the computer-executable instructions and cause the processing system to:
resequence weight data for a machine learning model according to a sparsity of the weight data, wherein the sparsity of the weight data exceeds a weight data sparsity threshold;
disable one or more bit cells in a compute-in-memory (CIM) array based on the resequenced weight data;
resequence input data based on the resequenced weight data;
process the input data with bit cells not disabled in the CIM array to generate an output value;
apply a compensation to the output value based on the sparsity to generate a compensated output value; and
output the compensated output value.

26. The processing system of claim 25, wherein:
in order to disable one or more bit cells in the CIM array based on the resequenced weight data, the one or more processors are further configured to disable one or more tiles of bit cells, and
each tile of the one or more tiles comprises a plurality of bit cells with weight values of 0.

27. The processing system of claim 25, wherein the one or more processors are further configured to:
compress the resequenced weight data by removing any weight with a value of 0; and
store the compressed resequenced weight data in a memory.

28. The processing system of claim 27, wherein the one or more processors are further configured to:
retrieve the compressed resequenced weight data from the memory;
decompress the compressed resequenced weight data; and
write the decompressed resequenced weight data to the CIM array prior to processing the input data with bit cells not disabled in the CIM array to generate the output value.

* * * * *